(12) United States Patent
Hoshi

(10) Patent No.: US 6,399,283 B1
(45) Date of Patent: Jun. 4, 2002

(54) EXPOSURE METHOD AND ALIGNER

(75) Inventor: Tai Hoshi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/336,779

(22) Filed: Jun. 21, 1999

(30) Foreign Application Priority Data

Jun. 30, 1998 (JP) .......................................... 10-199772

(51) Int. Cl.[7] .................................................. G03F 7/20
(52) U.S. Cl. ........................ 430/312; 430/394; 430/396
(58) Field of Search ................................ 430/311, 312, 430/394, 396

(56) References Cited

U.S. PATENT DOCUMENTS

| | | | | |
|---|---|---|---|---|
| 4,687,980 A | * | 8/1987 | Phillipos et al. ............. | 318/640 |
| 4,977,361 A | * | 12/1990 | Phillips et al. .............. | 318/640 |
| 5,629,137 A | * | 5/1997 | Leedy ......................... | 430/313 |
| 5,654,127 A | * | 8/1997 | Leedy ......................... | 430/315 |
| 5,710,620 A | * | 1/1998 | Taniguchi .................... | 355/53 |
| 5,780,188 A | * | 7/1998 | Rolson ........................ | 430/30 |

FOREIGN PATENT DOCUMENTS

JP          11-143085          5/1999

* cited by examiner

Primary Examiner—Kathleen Duda
(74) Attorney, Agent, or Firm—Fitzpatrick, Cella, Harper & Scinto

(57) ABSTRACT

An aligning method includes steps of partitioning an original mask into a plurality of areas in which respective types of patterns are formed, providing respective exposure information corresponding to the patterns in different areas, on a pattern-by-pattern basis, and exposing a substrate to one type of pattern of the original mask after exposing the substrate to another type of pattern of the original mask, on the basis of the respective exposure information.

15 Claims, 5 Drawing Sheets

EXPOSURE METHOD AND ALIGNER

BACKGROUND OF THE INVENTION

1. Field of the Invention

The present invention relates to an exposure method and an aligner, and, more particularly, to an exposure method and an aligner for exposing a substrate to a fine circuit pattern. The exposure method and the aligner find applications in the manufacture of a diversity of devices, including semiconductor chips such as Ics and LSIs, display devices such as liquid-crystal panels, detector devices such magnetic heads, and image pickup devices such as CCDs.

2. Description of the Related Art

Currently, main-stream projection aligners, which are used when devices such as Ics, LSIs, and liquid-crystal displays are manufactured through photolithographic techniques, employ excimer lasers as a light source. However, a projection aligner employing an excimer laser as its light source has difficulty forming a fine line pattern as narrow as or narrower than 0.15 μm.

Theoretically, increasing the NA (numerical aperture) of an optical system or shortening the wavelength of an exposure light beam increases the line resolution. However, increasing the NA or shortening the wavelength of the exposure light is not easy, in practice. Specifically, since the depth of focus of a projection optical system is inversely proportional to the square of the NA and proportional to the wavelength $\lambda$, increasing the NA of the projection optical system reduces the depth of focus, making focus adjustment difficult and leading to a low manufacturing yield. Further, light transmittance of most glass materials is extremely low in the far ultraviolet region. For example, even fused quartz, which is typically used at a wavelength of $\lambda=248$ nm (in, e.g., a KrF excimer laser), drops to almost zero at a wavelength of $\lambda=193$ nm. There is not yet available any glass material that works in a range below an exposure light wavelength of $\lambda=150$ nm in an ordinary exposure, corresponding to a fine line pattern having a linewidth of 0.15 μm or narrower.

Japanese Patent Laid-Open No. 11-143085 entitled "EXPOSURE METHOD AND ALIGNER", and assigned to the same assignee as this application, discloses a high-resolution exposure method in which double exposures of two-beam interference exposure and standard exposure are performed on a substrate being exposed while a multi-value exposure on a substrate being exposed while a multi-value exposure distribution is given on the substrate being exposed at the same time. According to this disclosed method, a pattern having a minimum linewidth of 0.10 μm is formed using a projection aligner and an exposure light having a wavelength of $\lambda=248$ nm (e.g., a KrF excimer laser) and an NA of 0.6 at the image side of a projection optical system.

In the above disclosure, the two-beam interference exposure is performed using a phase shift mask (or reticle) having a linewidth of 0.1 μm L & S (line and space) with a coherent light, and then the standard exposure is performed using a mask (or reticle) bearing an actual element pattern having a minimum linewidth of 0.1 μm with a partially coherent light beam. In such a double exposure aligning method, two different exposure steps for two different pieces of information are required at each shot to form a single pattern. For this reason, the throughput of the aligner drops.

In a mask (or reticle) that is the original of a transfer pattern in conventional semiconductor manufacturing, the entire mask area 2, as a single area, has a single pattern (for one layer), as shown in FIG. 3, and the exposure information (e.g., exposure conditions and offsets) required to expose a substrate to the pattern is set on a per mask (reticle) basis.

To improve the throughput in a multiple-pattern aligning method, which forms a single type of pattern by exposing a substrate being exposed to a plurality of patterns at the same shot in an overlapped manner, the inventors of this invention have tried to shorten the interchange time of masks (e.g., reticles) by forming a plurality of types of patterns on a single mask (reticle).

Even when a conventional projection aligner has a plurality of areas 21 and 22 in a single mask (reticle) as shown in FIG. 4, however, there is no choice but to handle a plurality of patterns as the same pattern area using the same exposure information to complete the exposure in a single process. The conventional projection aligner thus suffers from accuracy degradation. To avoid this, the conventional projection aligner needs to process the substrate on a per area basis with the exposure information updated. In such a case, a plurality of processes needs to be performed on a single wafer, and the projection aligner suffers from accuracy degradation due to an alignment error taking place from process to process, resulting in a substantial drop in throughput due to the plurality of processes.

SUMMARY OF THE INVENTION

It is an object of the present invention to improve the throughput in a multiple-pattern aligning method which forms a single type of pattern by exposing the same shot area of a substrate being exposed to a plurality of types of patterns.

To achieve the above object, a plurality of patterns are respectively created in partitioned areas on a single original mask, and the patterns on the respective areas have different pieces of exposure information. The exposure information here includes at least one type of information from among information regarding (i) exposure conditions (e.g., an exposure setting, an exposure area, NA, σ (i.e., a coherent factor of the illumination optical system), an exposure quantity, reticle transmittance, etc.), (ii) alignment conditions (e.g., an alignment illumination mode, an alignment position, an alignment mark, etc.), and (iii) offsets (e.g., alignment, focus, tilt, etc). Preferably, one of the offsets is automatically measured in the projection aligner to automatically account for it in an exposure operation.

In a preferred embodiment of the present invention, the patterns and the exposure information are appropriately switched to expose the substrate to the plurality of types of patterns in a single process. Also performed is multiple exposure, in which the same area of the substrate is exposed to the plurality of types of patterns in an overlapped manner.

According to the present invention, the exposure information is given to a plurality of types of patterns formed on a single mask (reticle), on a per pattern basis. With this arrangement, a single wafer is exposed to each pattern in accordance with appropriate exposure information, rather than being exposed to the plurality of patterns in different processes. The aligner thus enjoys substantial improvements in accuracy and throughput, as compared to a conventional aligner, which performs a plurality of exposure processes for a plurality of types of patterns.

To achieve the foregoing objects, the present invention provides, in a first aspect, an aligning method that includes the steps of partitioning an original mask into a plurality of areas in which respective areas of patterns are formed, providing respective exposure information corresponding to the patterns in different areas, on a pattern-by-pattern basis, and exposing a substrate to one type of pattern of the original mask after exposing the substrate to another type of pattern of the original mask, on the basis of the respective exposure information.

In yet another aspect, the present invention provides a device manufacturing method that includes steps of partitioning an original mask into a plurality of areas in which respective types of patterns are formed, providing respective exposure information corresponding to the patterns in different areas, on a pattern-by-pattern basis, and exposing a substrate to one type of pattern of the original mask after exposing the substrate to another type of pattern of the original mask, on the basis of the respective exposure information, to manufacture a device.

DESCRIPTION OF THE PREFERRED EMBODIMENTS

Figure 1:
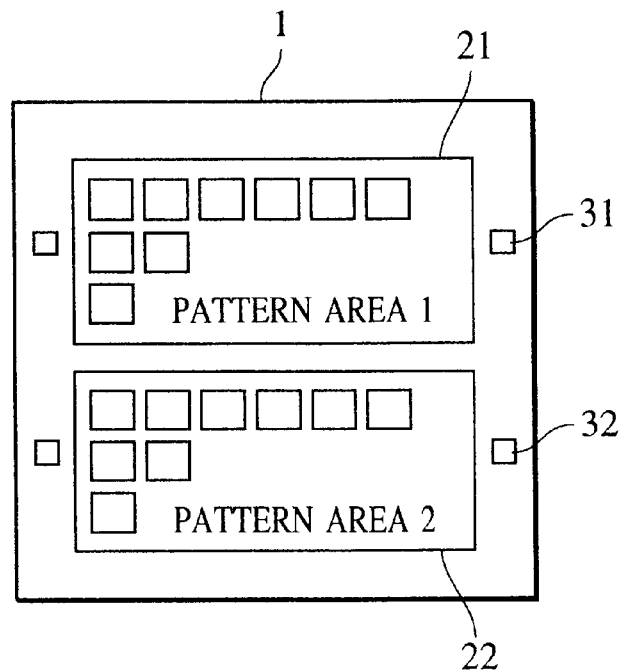
FIG. 1 shows a reticle of one embodiment of the present invention.

The embodiments of the present invention are now discussed, referring to the drawings, FIG. 1 shows a reticle of one embodiment of the present invention. There are shown a reticle 1, a first pattern 21, a second pattern 22, a reticle mark 31 for the first pattern 21, and a reticle mark 32 for the second pattern 22.

Figure 5:
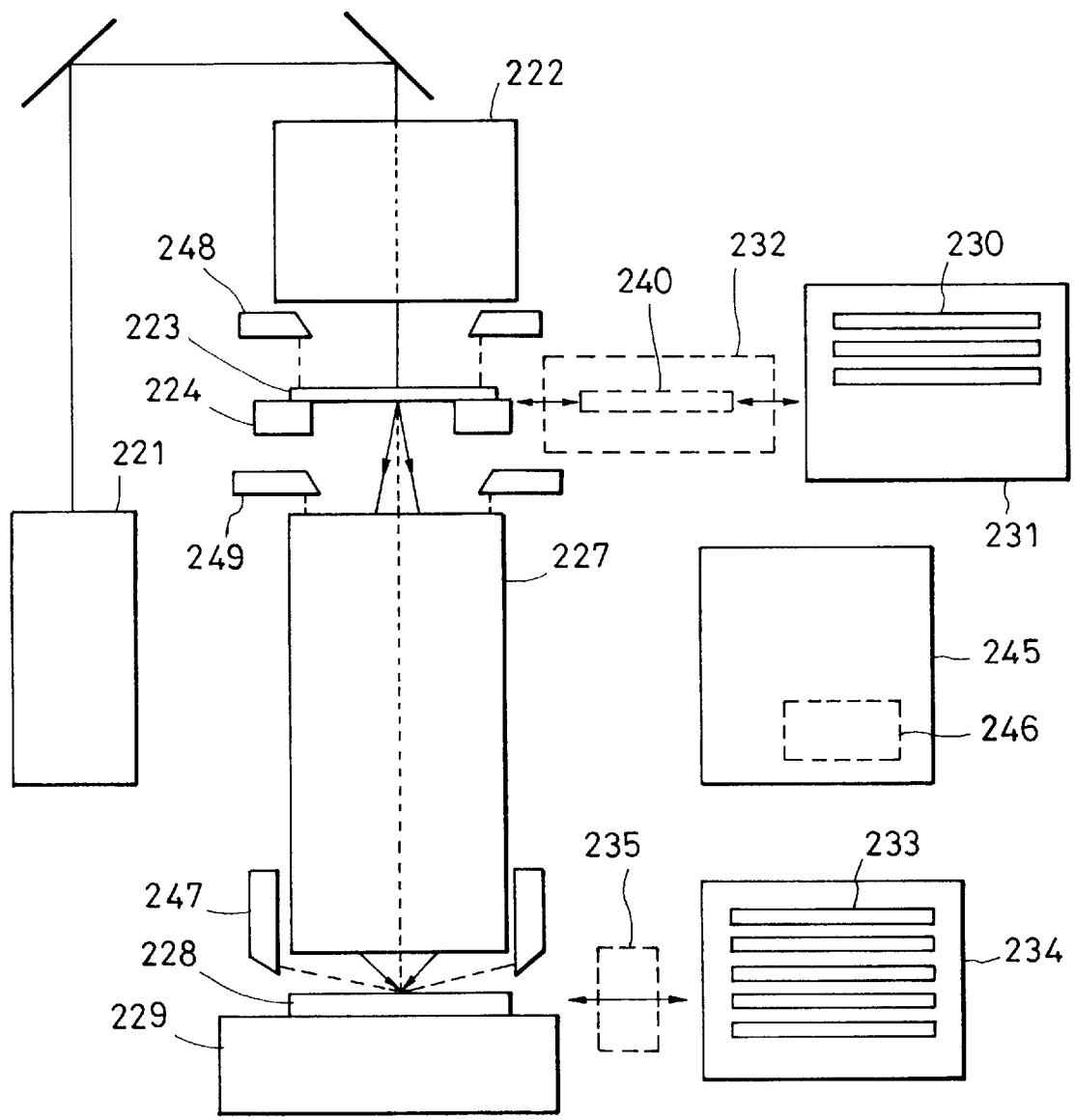
FIG. 5 shows a projection aligner of one embodiment of the present invention.

FIG. 5 is a block diagram showing a high-resolution projection aligner having a multiple-pattern exposure capability.

Referring to FIG. 5, there are shown an exposure light source 221 (e.g., a KrF excimer laser, an ArF excimer laser, or an F2 laser) and an illumination optical system 222 having a masking blade for defining an illumination area. Also shown are a mask (reticle) 223, a mask stage 224, which holds the mask 223 while being moved for scanning, and a projection optical system 227 for projecting a reduced image of a circuit pattern of the mask 223 onto a wafer 228. A step-and-scan wafer stage 229 is movable in a plane (X and Y directions) perpendicular to the optical axis of the projection optical system 227 and in the direction of the optical axis (Z direction). The position of the wafer stage 229 is precisely controlled using a laser interferometer. The projection aligner also includes a mask aligning optical system 248, and a wafer aligning optical system 249. The wafer aligning optical system 249 is available in any type of off-axis aligning optical system, TTL aligning optical system, TTR aligning optical system or the like.

Designated by 230 is a mask changer having a mask stocker for storing a plurality of masks. The mask changer 230 stores, in the stocker, a plurality of masks, for example, the reticle 1 shown in FIG. 1, supplied from an unshown reticle library. A mask feed mechanism 232 includes a reader 240 such as a bar-code reader for reading mask information carried by the mask, which is temporarily placed at a standby position prior to being fed to the mask stage 224. The mask feed mechanism 232 includes a handling mechanism for transporting the mask back and forth between the mask stocker and the standby position and between the standby position and the mask stage 224. In the mask transportation between the standby position and the mask stage 224, the mask feed mechanism 232 retrieves one mask while feeding another substantially at the same time for a quick mask interchange. The mask feed mechanism 232 selectively picks up a mask from the stocker 231, feeds it to the mask stage 224 via the standby position, and retrieves a used mask and feeds it into the stocker 231 via the standby position.

A wafer changer 234 includes a wafer stocker for storing a plurality of wafers 233. A wafer feed mechanism 235 includes a handling mechanism for transporting back and forth the wafer 233 between the wafer stocker and the wafer. stage 229. The wafer feed mechanism 235 picks up a wafer from the wafer stocker, feeds it to the wafer stage 229, and retrieves an exposed wafer and feeds it into the wafer stocker.

The operation of the projection aligner thus constructed is now discussed. The present invention applies to a step-and-scan operational sequence in this embodiment, but equally applies to a step-and-repeat operational sequence in which exposures are performed onto a single shot area at a time.

The step-and-scan operational sequence basically repeats a step operation in which the wafer stage is moved in the X direction or Y direction to position a shot area for exposure, and a scan operation in which the wafer is exposed while being scanned with the mask stage and the wafer stage being moved in synchronization. In the scan operation, the mask stage and the wafer stage are moved at constant speeds in a predetermined speed ratio synchronization (e.g., 4:1 in this embodiment), relative to an illuminating light beam having a slit shape in cross section and a projection optical system. One shot area of the wafer is exposed to the entire pattern of the mask for mask transfer.

Referring to FIG. 5, there is shown an autofocus detecting optical system 247 for detecting the position of the wafer 228 along the optical axis (Z direction) of the projection optical system 227. The autofocus detecting optical system 247 is used to adjust the wafer surface to the position where the image of the pattern of the mask 223 is focused by the projection optical system 227. The projection aligner also includes a controller 245 for controlling the elements in the projection aligner shown in FIG. 5, and memory means 246 arranged in the controller 245. The controller 245 is interconnected to each unit in the projection aligner via communication lines so that information transfer is made therebetween, though interconnects therebetween are not shown in FIG. 5.

When an exposure is made through the reticle 1 shown in FIG. 1, the projection aligner shown in FIG. 5 reads beforehand, from an unshown storage unit such as a hard disk, the exposure conditions such as an exposure position, an exposure area, NA, σ, an exposure quantity, and reticle transmittance, and the alignment conditions such as an alignment illumination mode, an alignment position, and an alignment mark. The projection aligner then stores this information in the memory means 246 (such as a RAM) in the controller 245, which controls the projection aligner. When the reticle 223, which is the original for exposure, is set on the mask stage 224, reticle offsets (e.g., shift, rotation, magnification and configuration) are measured through the reader 240 and/or the mask aligning optical system 248, and the measurements are then stored in the memory means 246 in the controller 245. When the wafer being exposed is loaded on the wafer stage 229, the wafer aligning optical system 249 makes global alignment measurements in an automatic mode using the reticle mark 31 of the first pattern 21, and an unshown wafer mark formed on the wafer 228, and also makes global :alignment measurements in an automatic mode using the reticle mark 32 of the second pattern 22 and the above-described wafer mark. Along with these measurements, the projection aligner performs focus measurements to the wafer surface using the autofocus detecting optical system 247. From these measurements, offsets including focus offset, leveling offset, alignment offsets (e.g., wafer shift, wafer rotation, wafer magnification, chip shift, chip rotation, chip magnification, etc.) are calculated. These offsets are also stored in the memory means 246 in the controller 245.

The exposure information (e.g., the exposure conditions, the alignment conditions and the offsets) relating to the first pattern 21 on the reticle 1 is read from the memory means 246, and is then set. Each exposure area of the wafer is exposed to the first pattern 21. Then, the exposure information (e.g., the exposure conditions, the alignment conditions and the offsets) relating to the second pattern 22 on the reticle 1 is read from the memory means 246, and is then set. Each exposure area of the wafer is then exposed to the second pattern 22. In this manner, two patterns are projected onto the wafer 228 based on respective pieces of exposure information, without replacing the reticle 1 and without remounting the wafer 228.

In this embodiment, the exposure information is set in accordance with the pattern areas on the reticle 1 on a per pattern basis. An optimum illumination (exposure) condition is used in consideration of the difference between pattern areas. By setting an optimum offset for each pattern area, the manufacturing accuracy and the margin of accuracy are increased. The projection aligner thus provides an increased throughput, compared to a conventional projection aligner that performs dual exposure processes. With the automatic measurements and automatic factoring function of the reticle offsets, the projection aligner achieves even higher accuracy.

The offsets in the exposure information include composite components such as the alignment error and the reticle error. No particularly serious problem takes place in the conventional method in which one reticle is used for a single pattern. In the present invention, with one reticle provided for a plurality of patterns, if the wafer is exposed to different portions of the reticle in a single alignment, errors in the position and configuration from pattern to pattern directly lead to accuracy degradation. Further, setting the reticle offsets from the exposure results takes a lot of manpower. With the automatic measurements and automatic factoring of the reticle off sets, however, manpower required for setting the offset relating to the reticle is reduced, while the accuracy level is maintained.

This embodiment applies to each of the step-and-repeat projection aligner (stepper), and the step-and-scan projection aligner (scanning projection aligner). When this embodiment applies to the scanning projection aligner, a plurality of areas are arranged in the direction of the scan so that the exposure information is instantaneously switched at the border between pattern areas in the course of scanning. To perform multiple-pattern exposures, the reticle and the wafer are aligned for exposure in a manner such that pattern areas formed on the single reticle are projected onto the same exposure position on the wafer.

Figure 2:
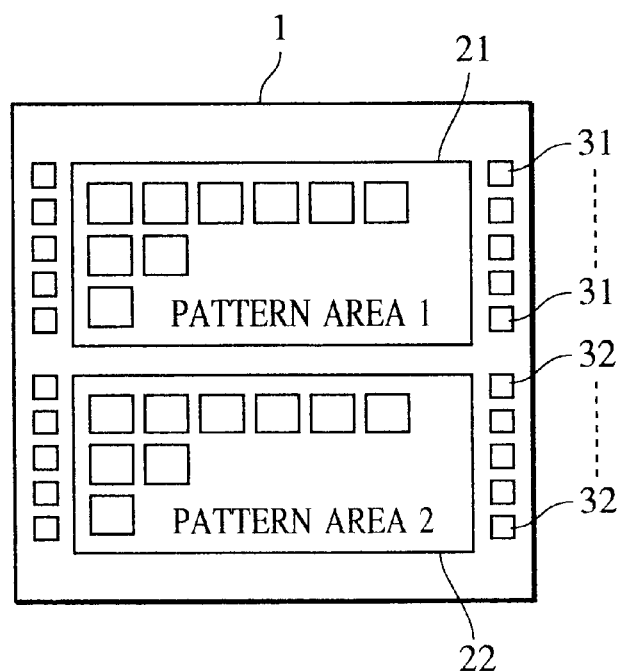
FIG. 2 shows a reticle of another embodiment of the present invention.
Figure 3:
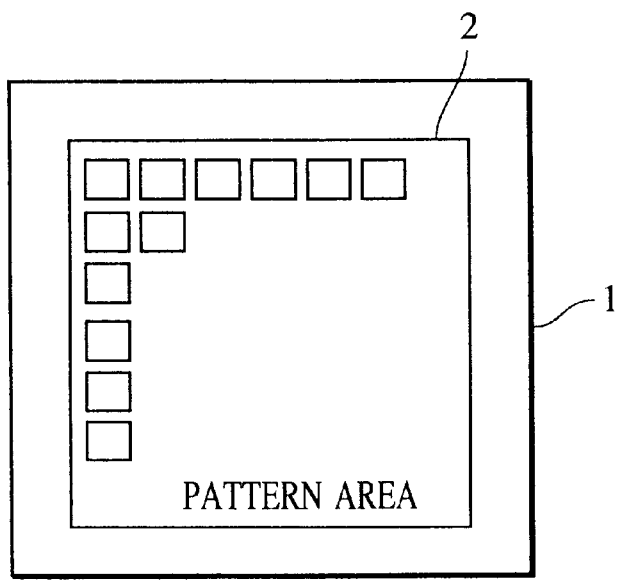
FIG. 3 shows a conventional single-pattern reticle.
Figure 4:
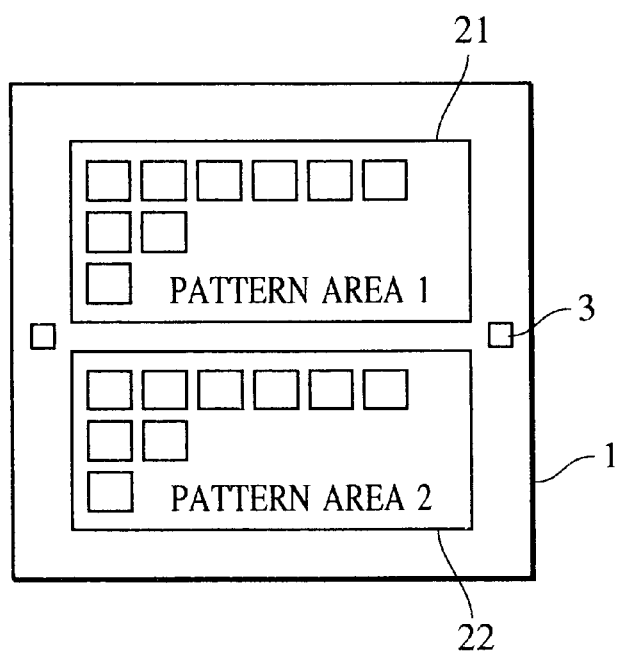
FIG. 4 shows a two-pattern reticle that is formed based on the conventional art.

FIG. 2 shows a reticle of another embodiment of the present invention. In the reticle shown in FIG. 1, two reticle marks are formed for each pattern area. Referring to FIG. 2, the number of reticle marks used in the reticle 1 is increased to five pairs. With this arrangement, a yawing correction is possible in the scanning projection during the scanning, and a more precise exposure is thus expected.

The single-reticle, single-process flow sequence is an advantageous aligning method in terms of accuracy and process speed, and is an essential technique required in the double exposures, which-motivated the inventors to develop the present invention. Considering the technology trend towards a large-scale reticle and a large diameter wafer, the single-reticle, single-process flow with a plurality of patterns on the single reticle is expected to become main-stream technology.

Discussed next is an embodiment for manufacturing devices based on the projection aligner and aligning method described above.

Figure 6:
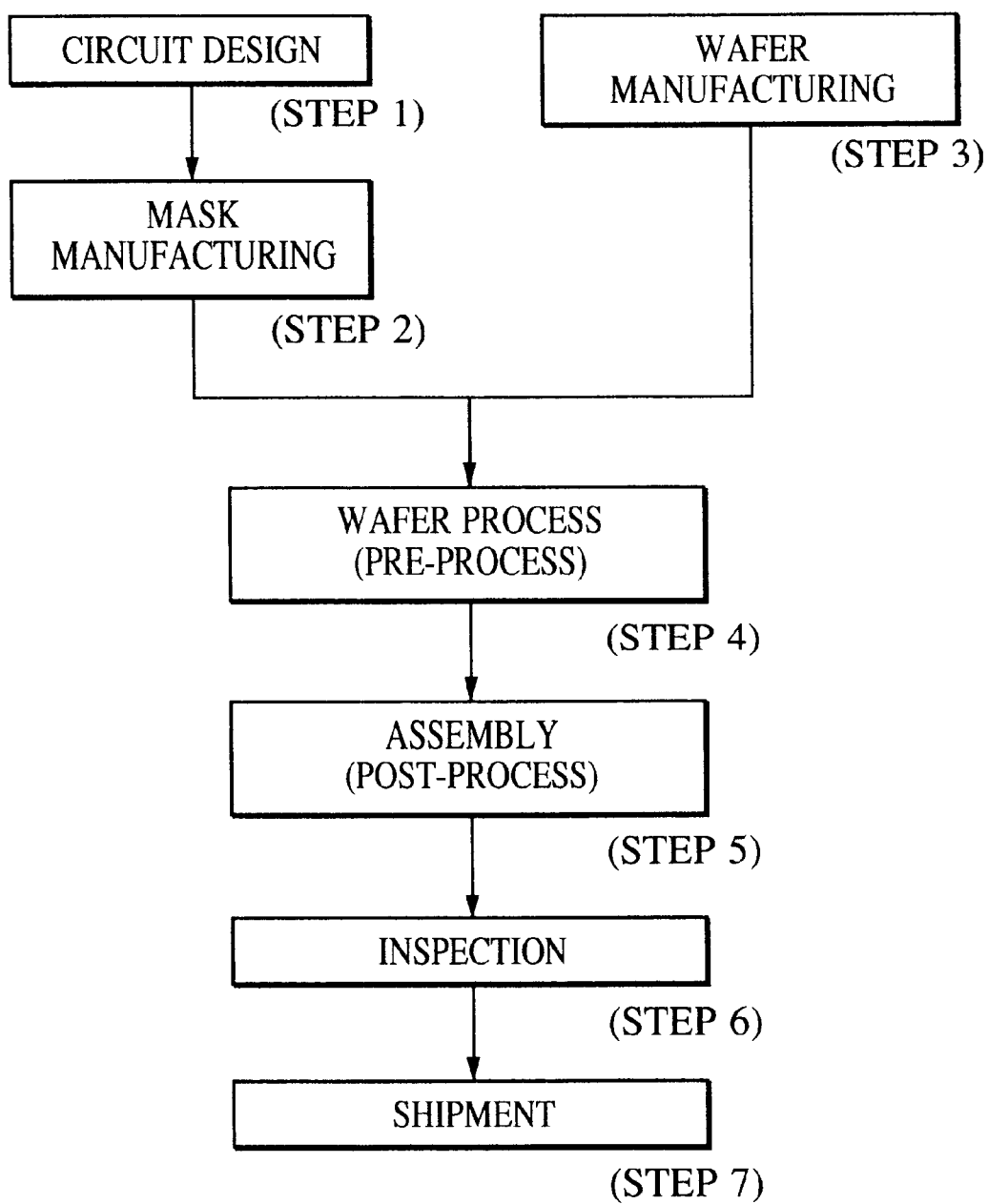
FIG. 6 is a flow diagram showing the manufacture of a micro device.

FIG. 6 shows the process of manufacturing micro devices (e.g., semiconductor chips such as Ics and LSIs, liquid-crystal panels, CCDs, thin-film magnetic heads, and micro-machines). In step 1 (circuit design), a circuit of a semiconductor device is designed. In step 2 (mask manufacturing), a mask of the circuit pattern designed is manufactured. In step 3 (wafer manufacturing), a wafer is manufactured using a material such as silicon or glass. Step 4 (wafer process) is called a pre-process, and forms an actual circuit on the wafer using the so prepared mask and the wafer through lithographic techniques. Step 5 (assembly) is called a post-process, and produces a semiconductor chip from the wafer manufactured in step 4. Step 5 includes an assembly step (dicing and bonding), and packaging step (chip encapsulating). In step 6 (inspection), operation tests and endurance tests are conducted on the semiconductor device manufactured in step 5. After undergoing these steps, the semiconductor device is completed and shipped (step 7).

Figure 7:
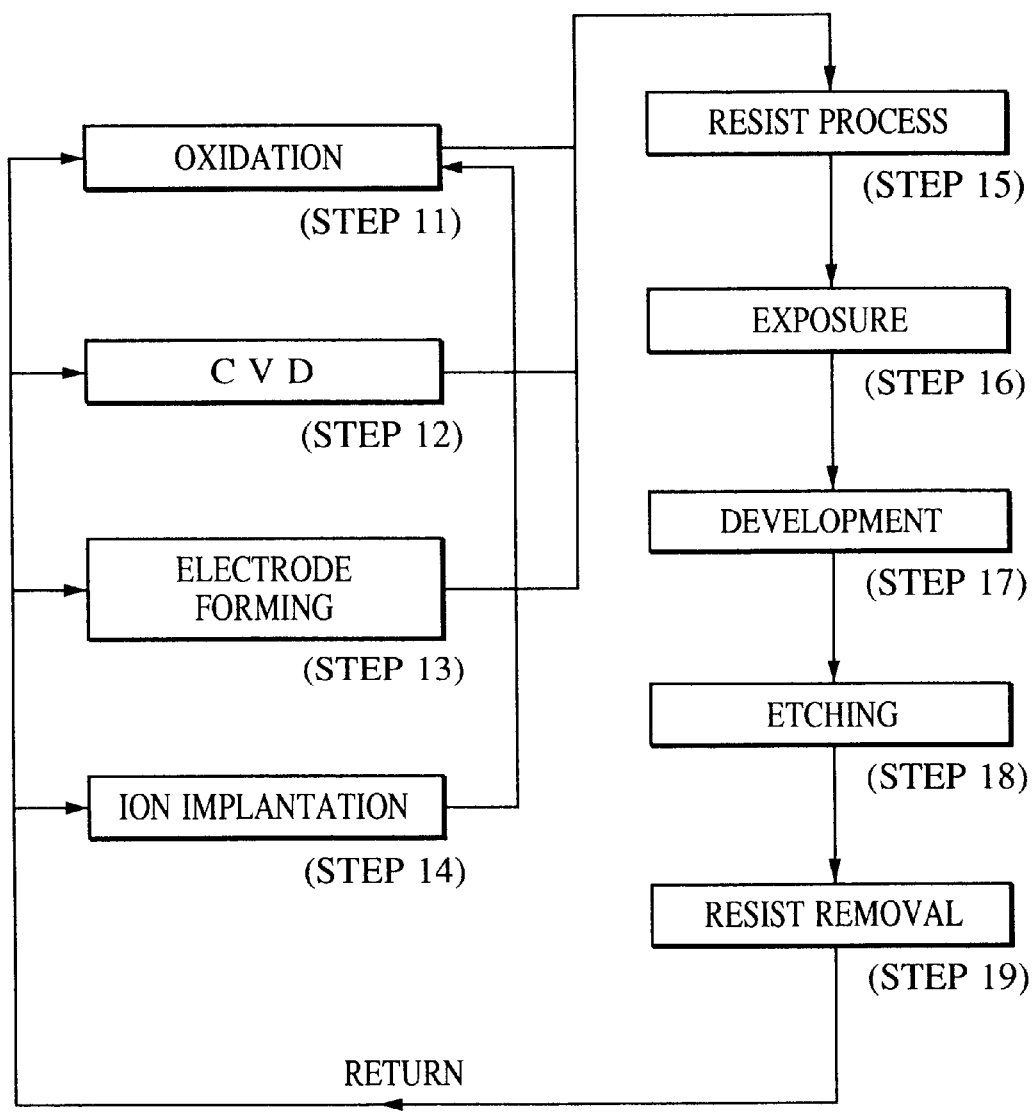
FIG. 7 is a detailed flow diagram of a wafer process in the projection aligner shown in FIG. 5.

FIG. 7 is a detailed flow diagram of the wafer process. In step 11 (oxidation), the surface of the wafer is oxidized. In step 12 (chemical vapor deposition—CVD), an insulating film is formed on the wafer surface. In step 13 (electrode forming), an electrode is deposited on the wafer. In step 14 (ion implantation), ions are implanted to the wafer. In step 15 (resist process), a photosensitive agent is applied on the wafer. In step 16 (exposure), the wafer is exposed to the circuit pattern of a mask through the already-described projection aligner and aligning method. In step 17 (development), the exposed wafer is subjected to a development process. In step 18 (etching), a portion other than the developed resist image is etched away. In step 19 (resist removal), a resist, no longer required after etching, is removed. The circuit pattern is formed in a multi-layered fashion on the wafer after undergoing the repetition of these steps.

The manufacturing method of this embodiment permits, to be easily manufactured at a low cost, a semiconductor device having a high degree of integration, which was conventionally difficult to manufacture.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure method comprising the steps of:
    partitioning an original mask into a plurality of areas in which respective types of patterns are formed;
    providing respective exposure information corresponding to the patterns in different areas, on a pattern-by-pattern basis; and
    exposing a substrate to one type of pattern of the original mask in one exposure on the basis of the exposure information corresponding to the one type of pattern and exposing the substrate to another type of pattern of the original mask in a different exposure on the basis of the exposure information corresponding to the other type of pattern.

2. An exposure method according to claim 1, wherein the exposure information comprises at least one type of information from among information regarding (i) an exposure condition, (ii) an alignment condition and (iii) an offset.

3. An exposure method according to claim 2, wherein the exposure information comprises at least offset information and further comprising at least partly measuring the offset in an aligner and accounting for the offset in an exposure operation.

4. An exposure method according to claim 1, further comprising exposing the substrate to the plurality of types of patterns in a single process while appropriately switching the patterns and the exposure information.

5. An exposure method according to claim 1, further comprising exposing the same exposure area of the substrate to the plurality of types of patterns in an overlapped manner.

6. A device manufacturing method comprising the steps of:
    partitioning an original mask into a plurality of areas in which respective types of patterns are formed;
    providing respective exposure information corresponding to the patterns in different areas, on a pattern-by-pattern basis; and
    exposing a substrate to one type of pattern of the original mask in one exposure on the basis of the exposure information provided for the one type of pattern and exposing the substrate to another type of pattern of the original mask in a different exposure on the basis of the exposure information provided for the other type of pattern, to manufacture a device.

7. A device manufacturing method according to claim 6, wherein the exposure information comprises at least one type of information from among information regarding (i) an exposure condition, (ii) an alignment condition and (iii) an offset.

8. A device manufacturing method according to claim 7, wherein the exposure information comprises at least offset information and further comprising at least partly measuring the offset in an aligner and accounting for the offset in an exposure operation.

9. A device manufacturing method according to claim 6, further comprising exposing the substrate to the plurality of types of patterns in a single process while appropriately switching the patterns and the exposure information.

10. A device manufacturing method according to claim 6, further comprising exposing the same exposure area of the substrate to the plurality of types of patterns in an overlapped manner.

11. A device manufacturing method comprising the steps of:
    holding, using holding means, an original mask, which is partitioned into a plurality of areas in which respective types of patterns are formed;
    setting respective exposure information corresponding to each pattern, on a pattern-by-pattern basis; and
    exposing a substrate to one type of pattern of the original mask in one exposure on the basis of the exposure information corresponding to the one type of pattern and exposing the substrate to another type of pattern of the original mask in a different exposure, in accordance with the exposure information corresponding to the other type of pattern.

12. A device manufacturing method according to claim 11, wherein the exposure information comprises at least one type of information from among information regarding (i) an exposure condition, (ii) an alignment condition and (iii) an offset.

13. A device manufacturing method according to claim 12, wherein the exposure information comprises at least offset information and further at least partly measuring the offset in the aligner to account for the offset in an exposure operation.

14. A device manufacturing method according to claim 11, further comprising exposing the substrate to the plurality of types of patterns in a single process while appropriately switching the patterns and the exposure information.

15. A device manufacturing method according to claim 11, further comprising exposing the same exposure area of the substrate to the plurality of types of patterns in an overlapped manner.

* * * * *

UNITED STATES PATENT AND TRADEMARK OFFICE
CERTIFICATE OF CORRECTION

PATENT NO.     : 6,399,283 B1
DATED          : June 4, 2002
INVENTOR(S)    : Tai Hoshi It is certified that error appears in the above-identified patent and that said Letters Patent is hereby corrected as shown below:

Title page,
Item [56], U.S. PATENT DOCUMENTS, the first-listed patent, "Phillipos et al." should read -- Phillips et al. --.

Column 1,
Line 47, should be deleted in its entirety.

Column 4,
Line 20, "wafer." should read -- wafer --.

Column 5,
Line 9, ":alignment" should read -- alignment --.
Line 56, "off sets," should read -- offsets, --.

Column 6,
Line 13, "which-motivated" should read -- which motivated --.

Signed and Sealed this

Twenty-second Day of July, 2003

JAMES E. ROGAN
*Director of the United States Patent and Trademark Office*